(12) United States Patent
Chen et al.

(10) Patent No.: US 7,931,818 B2
(45) Date of Patent: Apr. 26, 2011

(54) PROCESS OF EMBEDDED CIRCUIT STRUCTURE

(75) Inventors: Tsung-Yuan Chen, Taoyuan County (TW); Chun-Chien Chen, Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 740 days.

(21) Appl. No.: 11/934,500

(22) Filed: Nov. 2, 2007

(65) Prior Publication Data

US 2008/0280032 A1 Nov. 13, 2008

(30) Foreign Application Priority Data

May 11, 2007 (TW) .............................. 96116845 A

(51) Int. Cl.
*H01B 13/00* (2006.01)
(52) U.S. Cl. ............... 216/19; 216/13; 216/18; 438/624
(58) Field of Classification Search .................... 216/13, 216/18, 19, 20; 438/622, 625, 624
See application file for complete search history.

(56) References Cited

U.S. PATENT DOCUMENTS

| | | | |
|---|---|---|---|
| 6,376,052 B1 * | 4/2002 | Asai et al. ..................... 428/209 |
| 2003/0148136 A1 * | 8/2003 | Yamamoto et al. ........... 428/607 |

FOREIGN PATENT DOCUMENTS

| TW | 518616 | 1/2003 |
|---|---|---|
| TW | I251455 | 3/2006 |

OTHER PUBLICATIONS

Chinese Examination Report of Taiwan Application No. 096116845, dated May 12, 2010.

* cited by examiner

*Primary Examiner* — Lan Vinh
(74) *Attorney, Agent, or Firm* — J.C. Patents

(57) ABSTRACT

A process of an embedded circuit structure is provided. A complex metal layer, a prepreg, a supporting board, another prepreg and another complex metal layer are laminated together, wherein each of the complex metal layers has an inner metal layer and an outer metal layer stacked on the inner metal layer, the roughness of the outer surfaces of the inner metal layers is less than the roughness of the second outer surfaces of the outer metal layers, and the outer surfaces of the outer metal layers after laminating are exposed outwards. Each of two patterned photoresist layers is respectively formed on the outer surfaces of the outer metal layers. A metal material is created on portions of the outer surfaces of the outer metal layers not covered by the patterned photoresist layers to form two patterned circuit layers. The patterned photoresist layers are then removed to form a laminating structure.

5 Claims, 3 Drawing Sheets

PROCESS OF EMBEDDED CIRCUIT STRUCTURE

CROSS-REFERENCE TO RELATED APPLICATION

This application claims the priority benefit of Taiwan application serial no. 96116845, filed May 11, 2007. All disclosure of the Taiwan application is incorporated herein by reference.

BACKGROUND OF THE INVENTION

1. Field of the Invention

The present invention generally relates to an embedded circuit structure, and more particularly, to a process of an embedded circuit structure.

2. Description of Related Art

Along with the increasing contact count and contact density of an integrated circuit chip, a circuit carrier for packaging the chip needs a higher contact density and a higher wiring density to suit the tendency. In addition to the circuit carrier for packaging the chip, the circuit carrier used by a motherboard of an electronic product also gradually tends to high wiring density design to suit the miniaturization and thin-shape trend of electronic products. Therefore, the demand on circuit carriers with high wiring density is gradually growing.

The fabrication way of a circuit carrier today basically includes laminating process and build-up process. In terms of laminating process, when a patterned circuit layer on the surface of a dielectric layer is completed, required patterned circuit layers and dielectric layers are laminated into a laminating structure, following by plating through-hole to connect the patterned circuit layers located at different levels. In terms of build-up process, patterned circuit layers and dielectric layers are sequentially formed over a substrate, and meanwhile, conductive vias for successively connecting the previous patterned circuit layer are simultaneously fabricated during sequentially fabricating the patterned circuit layers.

U.S. Pat. No. 5,504,992 discloses a wiring board fabrication process, wherein a photoresist pattern is respectively formed on a thin metal layer located on each surface of a carrier metal foil; then the carrier metal foil is taken as a plating seed layer and a wiring pattern is formed on parts of the carrier metal foil not covered by the photoresist pattern; thereafter, the photoresist pattern is removed; further, the above-mentioned two wiring patterns are respectively embedded in both surfaces of a same dielectric layer to form a laminating structure, following by forming through-holes in the laminating structure and plating the inner walls of the through-holes with conductive material to form conductive vias for connecting the above-mentioned two wiring patterns; finally, the carrier metal foils and the thin metal layers are removed, and only the dielectric layer, the wiring patterns embedded in both surfaces of the dielectric layer and the conductive vias for connecting the wiring patterns are remained.

SUMMARY OF THE INVENTION

Accordingly, the present invention is directed to a process of an embedded circuit structure for increasing wiring density.

The present invention provides a process of an embedded circuit structure. At first, two complex metal layers, two prepregs and a supporting board are laminated, wherein the supporting board is located between the prepregs, the prepregs are located between the complex metal layers and the supporting board. Each of the complex metal layers has an inner metal layer and an outer metal layer stacked on the inner metal layer. The roughness of a first outer surface of the inner metal layer away from the outer metal layer is less than the roughness of s second outer surface of the outer metal layer away from the inner metal layer. The second outer surfaces of the outer metal layers after laminating are exposed outwards. Next, two patterned photoresist layers are respectively formed on the two second outer surfaces of the outer metal layers. Then, a metal material is formed on portions of the second outer surfaces of the outer metal layers not covered by the patterned photoresist layers to form two patterned circuit layers. After that, the patterned photoresist layers are removed to form a laminating structure. Furthermore, another laminating structure same as the above-mentioned one is laminated with the above-mentioned laminating structure through a dielectric layer, wherein the patterned circuit layers near to the dielectric layer are embedded in the dielectric layer.

In an embodiment of the present invention, portions of the laminating structures may be removed, and the patterned circuit layers embedded in the dielectric layer and the outer metal layers connecting the patterned circuit layers are remained.

In an embodiment of the present invention, in the step of removing portions of the laminating structures, the inner metal layers may be removed out of the outer metal layers in physical means or chemical means.

In an embodiment of the present invention, the roughness of the second outer surfaces of the outer metal layers may be sufficient to adhere the corresponding patterned photoresist layers thereon.

In an embodiment of the present invention, the step of forming a metal material may include using the outer metal layers as plating seed layers and using plating to form the metal material.

In an embodiment of the present invention, the step of forming a metal material may include electrolytic deposition, chemical deposition, vapor deposition or sputtering.

The present invention further provides a process of an embedded circuit structure. At first, a complex metal layer having an inner metal layer and an outer metal layer stacked on the inner metal layer are provided, wherein the roughness of the first outer surface of the inner metal layer away from the outer metal layer is less than the roughness of the second outer surface of the outer metal layer away from the inner metal layer. Next, the complex metal layer is laminated onto a supporting board in this way that the first outer surface of the inner metal layer is placed against a surface of the supporting board so as to make the second outer surface of the outer metal layer exposed outwards. Then, a patterned photoresist layer is formed on the second outer surface of the outer metal layer. After that, a metal material is formed on portions of the second outer surface of the outer metal layer not covered by the patterned photoresist layer to form a patterned circuit layer. Thereafter, the patterned photoresist layer is removed. Further, a dielectric layer onto the outer metal layer and the patterned circuit layer. Finally, the inner metal layer and the supporting board are removed.

In an embodiment of the present invention, the step of laminating the complex metal layer onto the supporting board is laminating the complex metal layer onto the supporting board through a prepreg.

In an embodiment of the present invention, the roughness of the second outer surface of the outer metal layer is sufficient to adhere the patterned photoresist layer thereon.

In an embodiment of the present invention, the step of forming a metal material includes using the outer metal layer as plating seed layer and using plating to form the metal material.

In an embodiment of the present invention, the step of forming a metal material includes electrolytic deposition, chemical deposition, vapor deposition or sputtering.

In an embodiment of the present invention, in the step of removing the inner metal layer, the process further includes removing the inner metal layer out of the outer metal layer in physical means or chemical means.

Based on the above described, the present invention adopts a complex metal layer and a supporting board as an initial structure, and a patterned photoresist layer is formed on the outer metal layer located of the complex metal layer at the outer side of the complex metal layer and having a sufficient roughness to facilitate advancing the structure strength between the patterned photoresist layer and the metal layer adhered thereby, which increases the image resolution of the patterned photoresist layer and is accordingly helpful to increase the wiring density of successively formed patterned circuit layers.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
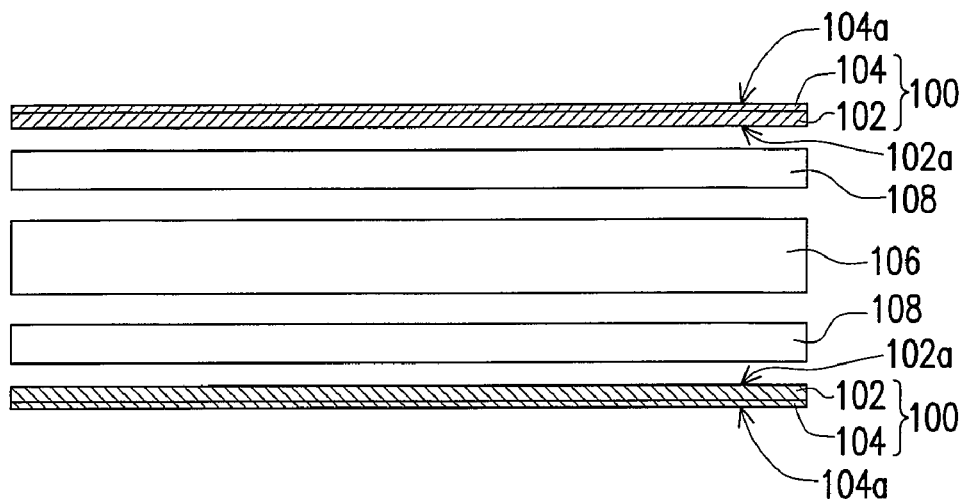
FIGS. 1A-1G are diagrams showing a process of an embedded circuit structure according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIGS. 1A-1G are diagrams showing a process of an embedded circuit structure according to an embodiment of the present invention. Referring to FIG. 1A, two complex metal layers 100 are provided, wherein each complex metal layer includes an inner metal layer 102 and an outer metal layer 104 stacked thereon, wherein the roughness of the first outer surface 102a of the inner metal layer 102 away from the outer metal layer 104 is less than the roughness of the second outer surface 104a of the outer metal layer 104 away from the inner metal layer 102, and the roughness of the second outer surface 104a is, for example, 0.1-10 µm. In the embodiment, the complex metal layer 100 is a complex copper layer, that is, the inner metal layer 102 is a copper layer with thickness of 14 µm or so, while the outer metal layer 104 is another copper layer with thickness of 3 µm or so. In other embodiments, the material of the inner metal layer 102 may be aluminium or stainless steel, while the material of the outer metal layer 104 may be nickel or tin.

Referring to FIG. 1A again, the present embodiment further provides a supporting board 106. The material of the supporting board 106 may be metal or resin. In order to facilitate the successive steps to respectively join the complex metal layers 100 onto both surfaces opposite to each other of the supporting board, in the embodiment, a prepreg 108 is disposed in advance between each of the complex metal layers 100 and the supporting board 106, wherein the prepregs 108 are, for example, a glass fabric adhering semi-cured resin. In addition, the prepregs 108 may be replaced by other adhesive polymers, for example, single-liquid or double-liquid adhesive resin.

Figure 1B:
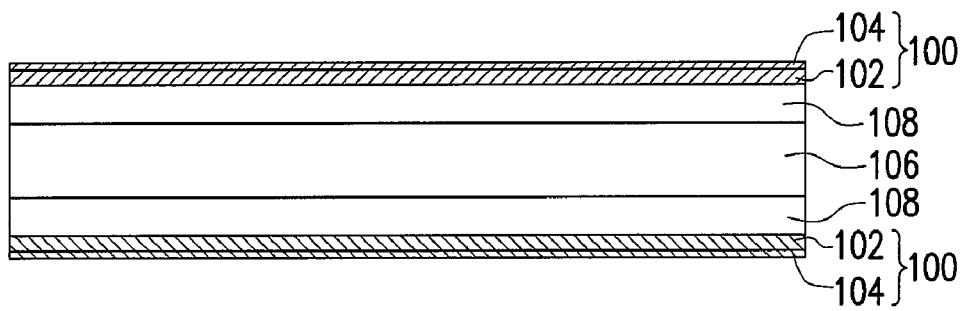

Referring to FIG. 1B, the complex metal layers 100 are then laminated onto two surfaces of the supporting board 106 in this way that placing the first outer surfaces 102a of the inner metal layers 102 against the surfaces of the supporting board 106 so as to make the second outer surfaces 104a (FIG. 1A) of the outer metal layers 104 exposed outwards. In the embodiment, the inner metal layers 102 are laminated onto the supporting board 106 through the prepregs 108. Since the complex metal layers 100 are laminated onto the supporting board 106 by the prepregs 108, the prepregs 108 need to be heated during the laminating.

Figure 1C:
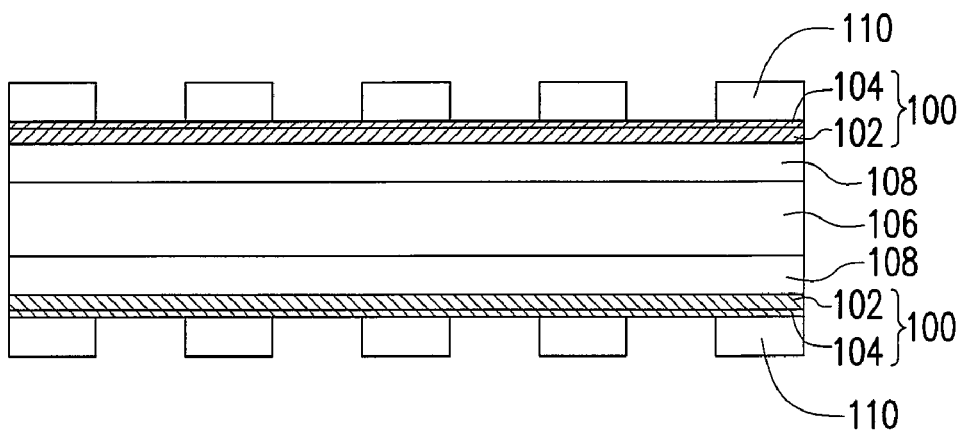

Referring to FIG. 1C, two patterned photoresist layers 110 are then respectively formed on the second outer surfaces 104a of the outer metal layers 104. Note that the roughness of the second outer surfaces 104a (FIG. 1A) of the outer metal layers 104 must be sufficient to adhere the patterned photoresist layers 110 thereon.

Figure 1D:
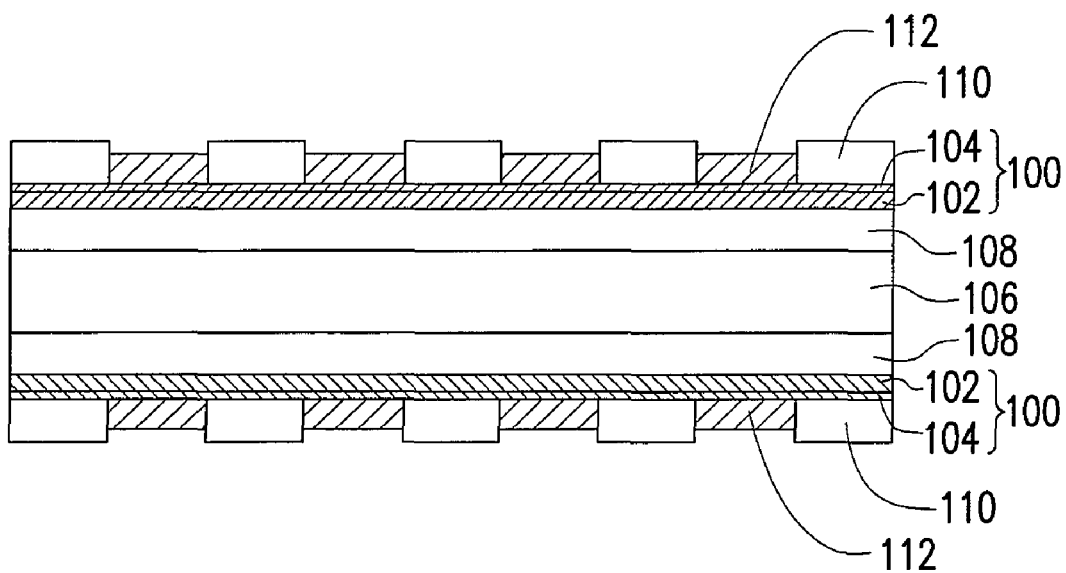

Referring to FIG. 1D, a metal material is then formed on portions of the second outer surfaces 104a of the outer metal layer 104 not covered by the patterned photoresist layers 110 to form two patterned circuit layers 112. In the embodiment, the method of forming a metal material includes using the outer metal layer 104 as a plating seed layer and using plating to form the metal material.

Figure 1E:
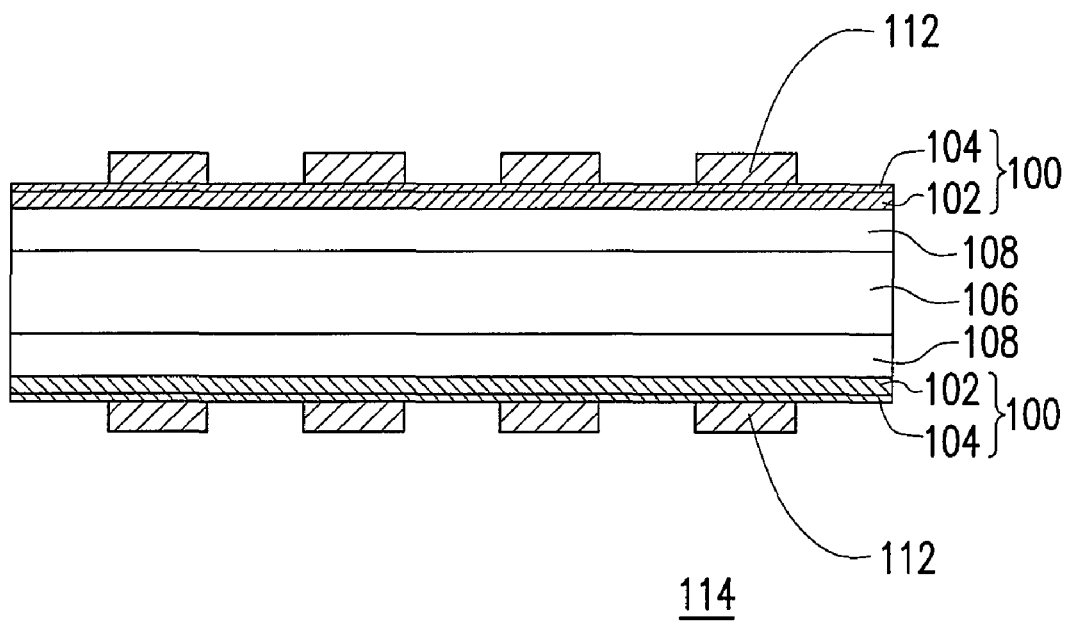

Referring to FIG. 1E, the patterned photoresist layers 110 are then removed to form a laminating structure 114.

Figure 1F:
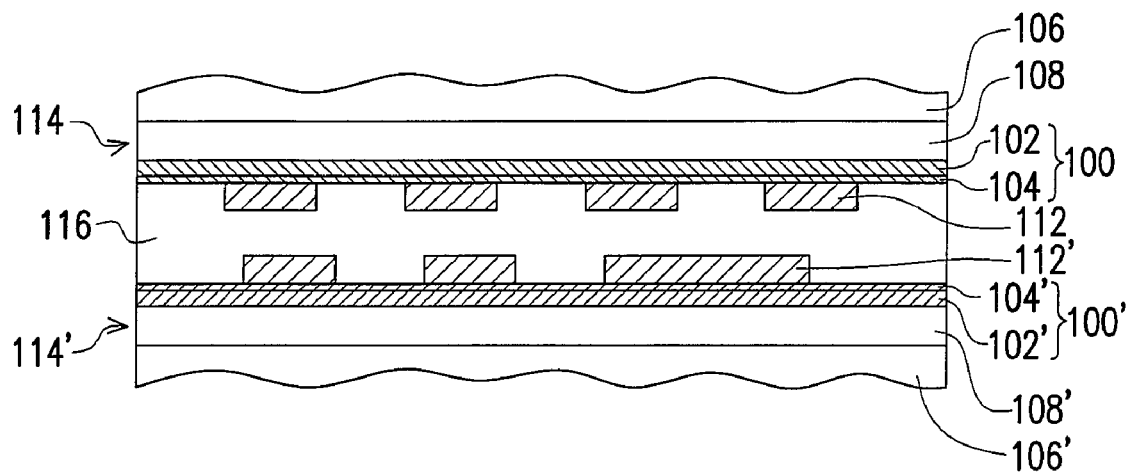

Referring to FIG. 1F, another laminating structure 114' same as the one in FIG. 1E is then laminated onto the outer metal layer 104 and the patterned circuit layer 112 through a dielectric layer 116. In the embodiment, the material of the dielectric layer 116 may be the same as the material of the prepreg 108 in FIG. 1A.

Figure 1G:
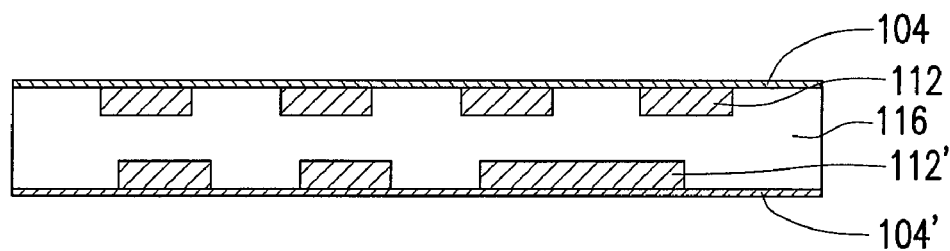

Referring to FIG. 1G, finally, the inner metal layers 102 and 102' of the complex metal layers 100 and 100', the supporting boards 106 and the prepregs 108 are removed, but the patterned circuit layers 112 and 112' embedded in the dielectric layer 116 and the outer metal layers 104 and 104' respectively connected to the patterned circuit layers 112 and 112' are remained. In the embodiment, by removing the inner metal layers 102 and 102', shown in FIG. 1F, respectively out of the outer metal layers 104 and 104' in physical means or chemical means, the prepreg 108 and 108' and the supporting boards 106, shown in FIG. 1F, are removed.

In summary, the present invention adopts a complex metal layer and a supporting board as an initial structure, and patterned photoresist layers are formed on the outer metal layer located at the outer side of the complex metal layer and having a sufficient roughness of the complex metal layer to facilitate advancing the structure strength between the patterned photoresist layers and the metal layer adhered thereby, which increases the image resolution of the patterned photoresist layers and is accordingly helpful to increase the wiring density of successively formed patterned circuit layers.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A process of an embedded circuit structure comprising:

laminating two complex metal layers, two prepregs and a supporting board, wherein the supporting board is located between the prepregs, the prepregs are located between the complex metal layers and the supporting board, each of the complex metal layers has an inner metal layer and an outer metal layer stacked on the inner metal layer, the roughness of the first outer surface of the inner metal layer away from the corresponding outer metal layer is less than the roughness of the second outer surface of the corresponding outer metal layer away from the corresponding inner metal layer, and the second outer surfaces of the outer metal layers after laminating are exposed outwards;

forming two patterned photoresist layers on the second outer surfaces of the outer metal layers respectively;

forming a metal material on portions of the second outer surfaces of the outer metal layers not covered by the patterned photoresist layers to form two patterned circuit layers;

removing the patterned photoresist layers to form a laminating structure;

laminating another laminating structure same as the laminating structure with the laminating structure through a dielectric layer, wherein the patterned circuit layers near to the dielectric layer are embedded in the dielectric layer, and removing portions of the laminating structures and remaining the patterned circuit layers embedded in the dielectric layer and the outer metal layers connecting the patterned circuit layers.

2. The process of an embedded circuit structure according to claim 1, wherein in the step of removing portions of the laminating structures, the inner metal layers are removed out of the outer metal layers in physical means or chemical means.

3. The process of an embedded circuit structure according to claim 1, wherein the roughness of the second outer surfaces of the outer metal layers is sufficient to adhere the corresponding patterned photoresist layers thereon.

4. The process of an embedded circuit structure according to claim 1, wherein the method of forming a metal material comprises using the outer metal layers as plating seed layers and using plating to form the metal material.

5. The process of an embedded circuit structure according to claim 1, wherein the method of forming a metal material comprises electrolytic deposition, chemical deposition, vapor deposition or sputtering.

* * * * *